(12) United States Patent
Tseng

(10) Patent No.: US 9,899,502 B2
(45) Date of Patent: Feb. 20, 2018

(54) BIPOLAR JUNCTION TRANSISTOR LAYOUT STRUCTURE

(71) Applicant: UNITED MICROELECTRONICS CORP., Hsin-Chu (TW)

(72) Inventor: Yuan-Heng Tseng, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/169,695

(22) Filed: May 31, 2016

(65) Prior Publication Data
US 2017/0317197 A1 Nov. 2, 2017

(30) Foreign Application Priority Data
Apr. 27, 2016 (TW) .............................. 105113040 A

(51) Int. Cl.
*H01L 29/737* (2006.01)
*H01L 29/735* (2006.01)
*H01L 29/06* (2006.01)
*H01L 29/08* (2006.01)
*H01L 29/10* (2006.01)

(52) U.S. Cl.
CPC ........ *H01L 29/735* (2013.01); *H01L 29/0692* (2013.01); *H01L 29/0808* (2013.01); *H01L 29/0821* (2013.01); *H01L 29/1008* (2013.01)

(58) Field of Classification Search
None
See application file for complete search history.

(56) References Cited

U.S. PATENT DOCUMENTS

| | | | |
|---|---|---|---|
| 7,705,425 B2 | 4/2010 | Ma et al. | |
| 7,897,995 B2 * | 3/2011 | Yang | H01L 29/0692 257/133 |
| 7,989,845 B2 | 8/2011 | Murayama et al. | |
| 8,415,764 B2 * | 4/2013 | Chung | H01L 27/0823 257/565 |
| 8,610,241 B1 | 12/2013 | Hu et al. | |
| 8,912,576 B2 | 12/2014 | Chung | |
| 8,946,038 B2 | 2/2015 | Hu et al. | |
| 9,035,426 B2 * | 5/2015 | Chang | H01L 29/735 257/197 |
| 2005/0151159 A1 | 7/2005 | Ma et al. | |
| 2010/0213507 A1 * | 8/2010 | Ko | H01L 21/8222 257/141 |
| 2010/0219504 A1 * | 9/2010 | Chen | H01L 21/8224 257/593 |
| 2013/0092939 A1 * | 4/2013 | Kim | H01L 29/66272 257/51 |
| 2014/0131831 A1 | 5/2014 | Wei et al. | |
| 2014/0183641 A1 | 7/2014 | Fan et al. | |
| 2014/0252476 A1 | 9/2014 | Chang et al. | |
| 2015/0123246 A1 | 5/2015 | Hu et al. | |

(Continued)

*Primary Examiner* — Ali Naraghi
(74) *Attorney, Agent, or Firm* — Winston Hsu

(57) ABSTRACT

A bipolar junction transistor layout structure includes a first emitter including a pair of first sides and a pair of second sides, a pair of collectors disposed at the first sides of the first emitter, and a pair of bases disposed at the second sides of the first emitter. The first sides are perpendicular to the second sides. The first emitter is disposed in between the pair of collectors and in between the pair of bases.

19 Claims, 3 Drawing Sheets

(56) References Cited

U.S. PATENT DOCUMENTS

2015/0179754 A1* 6/2015 Hung .................. H01L 29/6625
438/309
2016/0358822 A1* 12/2016 Hu ...................... H01L 21/8249

* cited by examiner

US 9,899,502 B2

BIPOLAR JUNCTION TRANSISTOR LAYOUT STRUCTURE

BACKGROUND OF THE INVENTION

1. Field of the Invention

The present invention relates to a bipolar junction transistor (hereinafter abbreviated as BJT) layout structure, and more particularly, to an emitter-central BJT layout structure.

2. Description of the Prior Art

As is well known to those of skill in the art, a BJT device is a three-terminal device that essentially including an emitter, a base and a collector. In normal operation, the emitter-base junction will be forward biased while the collector-base junction reversed biased by externally applied voltages, and the device is driven in a forward active mode. Furthermore, BJT device can be manufactured using complementary metal-oxide-semiconductor (CMOS) process, and therefore plays an important role in band-gap voltage reference circuits. Accordingly, BJT device often serves as switching device and is often used in high-voltage, high-frequency, and/or high-power applications.

A typical npn-BJT device includes an n-collector which is an n-well formed in a p-substrate, a p-base which is a p-well formed in the n-well, and an n-emitter which is an n-doped region formed in the p-well. And a typical pnp-BJT device includes electric characteristic complementary to the npn-BJT device. In order to enhance emitter injection efficiency, it has been developed to form the emitter enclosed by the base pick-up and the collector. In this approach, a relatively small base current (that is the input current, $I_B$) controls a relatively large collector current (that is the output current, $I_C$). And a ratio of the collector current $I_C$ over the base current $I_B$ is referred to current-gain β or beta-gain β:

$$\beta = I_C/I_B$$

The current-gain β increases in proportion to the collector current $I_C$ and is inversely proportional to the base current $I_B$. That is, the current-gain β is increased if the collector current $I_C$ is increased and/or if the base current $I_B$ is decreased. More important, it is found that BJT performance is improved with current-gain β increase. Furthermore, the current gain β varies as a function of the base area or the collector area. It is found that the current gain β is increased when the base area is reduced or when the collector area is increased. However, such increase is limited because the base area cannot be increased without violating a design rule.

In view of the foregoing, it is desirable to provide a BJT layout structure that can efficaciously increase the current gain β without violating the design rule.

SUMMARY OF THE INVENTION

According to the claimed invention, a BJT layout structure is provided. The BJT layout structure includes a first emitter including a pair of first sides and a pair of second sides, a pair of collectors disposed at the first sides of the first emitter, and a pair of bases disposed at the second sides of the first emitter. The first sides of the first emitter are perpendicular to the second sides of the first emitter. The first emitter is disposed in between the pair of collectors and also in between the pair of bases.

According to the claimed invention, another BJT layout structure is provided. The BJT layout structure includes a first emitter extended along a first direction, at least a collector extended along the first direction and immediately adjacent to the first emitter along a second direction, and at least a first base immediately adjacent to the first emitter along the first direction. The second direction is perpendicular to the first direction.

According to the present invention, an emitter-central BJT layout structure is provided with the bases and the collectors being disposed at different pair sides of the emitter. In other words, a collector-base arrangement is provided at two adjacent sides of the emitter. Therefore, the base area can be efficaciously reduced and thus the current-gain β is increased. As a result, BJT performance is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
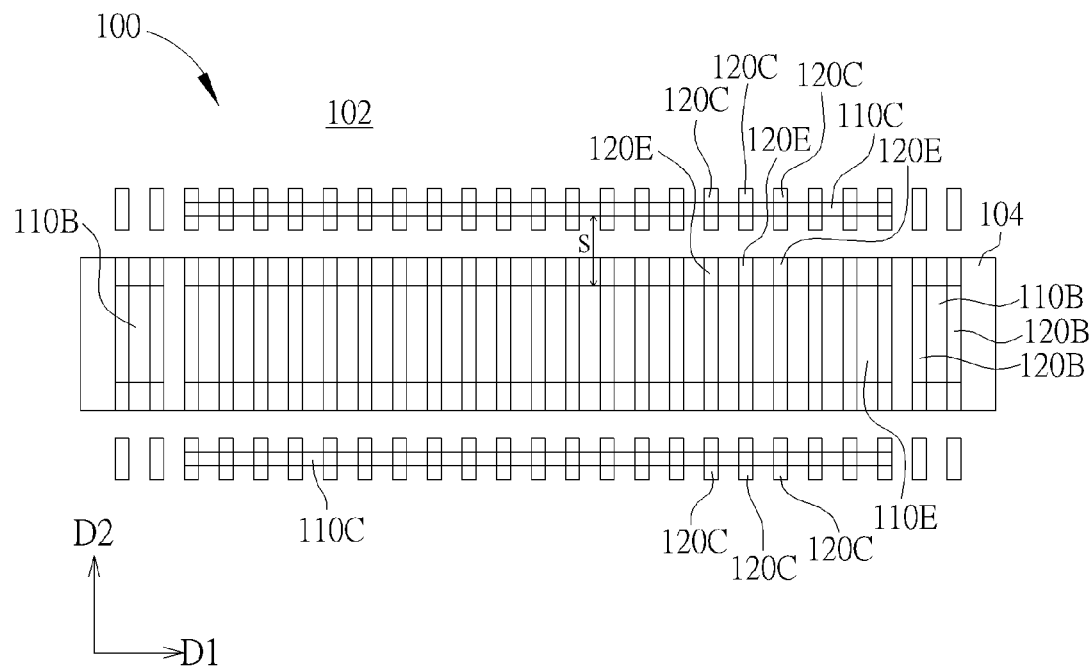
FIGS. 1 and 2 are schematic drawings illustrating a BJT layout structure provided by a first preferred embodiment of the present invention.
Figure 2:
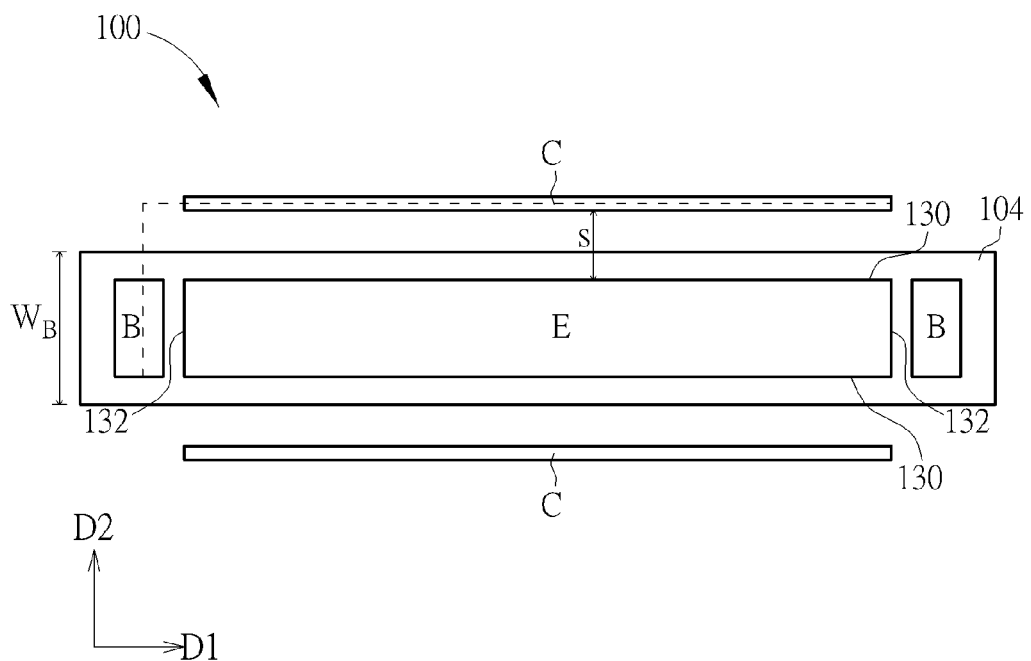

Please refer to FIGS. 1 and 2, which are schematic drawings illustrating a BJT layout structure provided by a first preferred embodiment of the present invention. As shown in FIG. 1, the BJT layout structure 100 provided by the preferred embodiment includes a substrate 102, and a well region 104 such as an n-well region is formed in the substrate 102. According to embodiments of the present invention, the well region 104 includes a conductivity type that is the same with the base of the BJT to be formed. Accordingly, when the BJT layout structure 100 is a pnp-BJT layout structure, the well region 104 includes the n type. Alternatively, when the BJT layout structure 100 is an npn-BJT layout structure, the well region 104 includes a p type. A first active region 110E, a pair of second active regions 110C and a pair of third active regions 110B are formed on the substrate 102. As shown in FIG. 1, the first active region 110E is extended along a first direction D1, and the second active regions 110C are also extended along the first direction D1. In other words, an extending direction of the first active region 110E is parallel with an extending direction of the second active regions 110C. The second active regions 110C are disposed at two opposite sides of the first active region 110E along the second direction D2 while the third active regions 110B are disposed at another two opposite sides of the first active region 110E along the first direction D1. In accordance with the preferred embodiment, the first direction D1 is perpendicular to the second direction D2.

It is noteworthy that fabrication of the conventional BJT can be integrated with fabrication of the conventional planar metal-oxide-semiconductor field-effect transistor (MOSFET). In some embodiments of the present invention, for example but not limited to, the collector of the BJT device is formed in the substrate, and the base of the BJT device is formed in the collector utilizing step(s) for forming a lateral well. And the emitter of the BJT device is formed in the base utilizing step(s) for forming lateral source/drain. However, the conventional BJT device fabricated by the conventional planar MOSFET process flow has poor performance and is thus not suitable for high performance applications. One cause of the poor performance is that the emitter is necessarily much smaller than the base. As such, the conventional BJT device has high emitter series resistance and low current conduction capability. Another cause of the poor performance is that the base-emitter junction of the convention BJT device is not well defined. As such, the conventional BJT device suffers high base leakage current. Therefore, the preferred embodiment provides an approach of fin-based BJT device. According to the approach, the first active region 110E includes at least a fin structure, the second active regions 110C respectively include at least a fin structure, and the third active regions 110B respectively include at least a fin structure. Amounts of the fin structures in the first active region 110E, the second active regions 110C and the third active regions 110B can be obtained by performing any well-known planar-fin conversion method. Furthermore, the fin structures can be formed by any known method and thus those details are omitted herein in the interest of brevity. Additionally, epitaxial layers can be formed on the fin structures in the first active region 110E, the second active regions 110C and the third active regions 110B in order to lower the contact resistance.

Please still refer to FIG. 1. According to the preferred embodiment, the BJT layout structure 100 further includes a plurality of first gate electrodes 120E. The first gate electrodes 120E are extended along the second direction D2 and arranged along the first direction D1. More important, the first gate electrodes 120E overlap the first active region 110E as shown in FIG. 1. The BJT layout structure 100 further includes a plurality of second gate electrodes 120C and a plurality of third gate electrodes 120B. The second gate electrodes 120C are extended along the second direction D2 and arranged along the first direction D1. And the second gate electrodes 120C overlap the second active regions 110C as shown in FIG. 1. The third gate electrodes 120B of the BJT layout structure 100 are extended along the second direction D2 and arranged along the first direction D1. And the third gate electrodes 120B overlap the third active regions 110B as shown in FIG. 1. Furthermore, the first gate electrodes 120E are parallel with the third gate electrodes 120B. The first gate electrodes 120E, the second gate electrodes 120C and the third gate electrodes 120B respectively include a gate dielectric layer (not shown) and a gate conductive layer (not shown). In some embodiments of the present invention, the gate conductive layer includes polysilicon, and the polysilicon is preferred to be doped, and a voltage can be applied thereon to change the characteristics of the resulting BJT.

Please refer to FIGS. 1 and 2. The first active region 110E and the first gate electrodes 120E construct an emitter E (shown in FIG. 2), and the emitter E is extended along the first direction D1. The second active regions 110C and the second gate electrodes 120C construct collector pick-ups, and are taken as a pair of collectors C (shown in FIG. 2) in accordance with the preferred embodiment. Accordingly, the collectors C are also extended along the first direction D1. The third active regions 110B and third gate electrodes 120B construct base pick-ups, and are taken as a pair of bases B (shown in FIG. 2) in accordance with the preferred embodiment. However, those skilled in the art would easily realize that the bases B include not only the third active regions 110B and the third gate electrodes 120B, which serve as base pick-ups as mentioned above, but also the well region 104. Furthermore, a plurality of contacts plugs can be provided to construct electrical connections for the emitter E, the collectors C and the bases B. As shown in FIG. 2, the BJT layout structure 100 provided by the preferred embodiment includes the emitter E, and the emitter E includes a pair of first sides 130 and a pair of second sides 132. And the first sides 130 are perpendicular to the second sides 132. Additionally, a length of the first sides 130 is preferably longer than a length of the second sides 132, but not limited to this. The BJT layout structure 100 further includes the pair of collectors C disposed at the first sides 130 of the emitter E. Specifically, the emitter E is disposed in between the pair of collectors C. The BJT layout structure 100 further includes the pair of bases B disposed at the second sides 132 of the emitter E. Specifically, the emitter E is disposed in between the pair of bases B. As shown in FIG. 2, the well region 104 is disposed under the emitter E and the pair of bases B.

More important, the collectors C and the emitter E are immediately adjacent to each other along the second direction D2. It is noteworthy that "immediately adjacent" is referred to that no conductive device and/or element, such as gate electrode and/or active region, is disposed in between the collectors C and the emitter E in accordance with the preferred embodiment. In the same concept, the bases B and the emitter E are immediately adjacent to each other along the first direction D1. And it is also referred to that no conductive device and/or element, such as gate electrode and/or active region, is disposed in between the bases B and the emitter E in accordance with the preferred embodiment. In other words, the preferred embodiment provides a "collector-base" arrangement at any two adjacent sides of the emitter E. And the collector-base arrangement includes an L shape, as depicted by the dotted line in FIG. 2.

Please still refer to FIGS. 1 and 2. According to the BJT layout structure 100 provided by the preferred embodiment, the emitter E includes the first active region 110E and the first gate electrodes 120E overlapped thereto, the collectors C include the second active regions 110C and the second gate electrodes 120C overlapped thereto, and the bases B include the third active regions 110B and the third gate electrodes 120B overlapped thereto. It is noteworthy that since no conductive device or element is disposed in between the collectors C and the emitter E, a spacing distance S between the emitter E and the collectors C can be reduced as much as possible. And thus current receiving is improved. More important, a width of the well region 104 can be reduced as much as possible as long as design rule is complied. According to the following equivalence (1):

$$I_C = \frac{A_E q D_p n_i^2 \exp(qV_{EB}/kT)}{N_B W_B} \quad \text{Equivalence (1)}$$

It is concluded that the collector current $I_C$ is in inverse proportion to the width $W_B$ of the base B. Therefore, by reducing the width $W_B$ of the base B, the collector current $I_C$ is increased and thus the current-gain β of the BJT layout structure 100 is enhanced.

Figure 3:
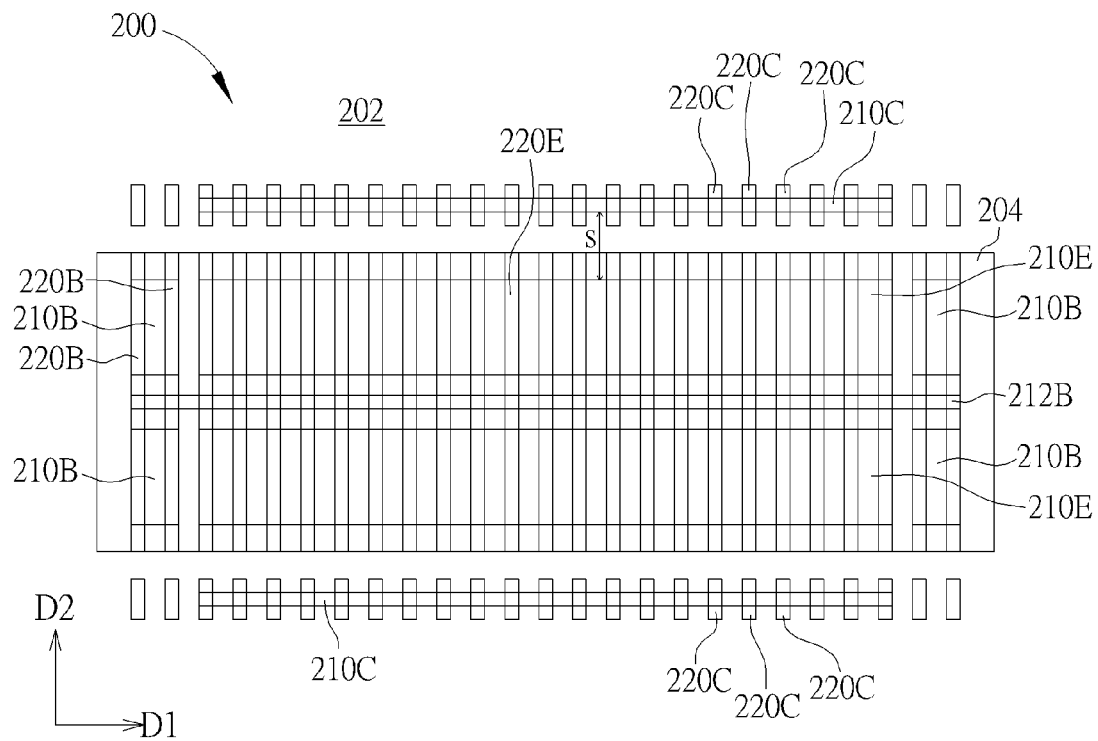
FIGS. 3 and 4 are schematic drawings illustrating a BJT layout structure provided by a second preferred embodiment of the present invention.
Figure 4:
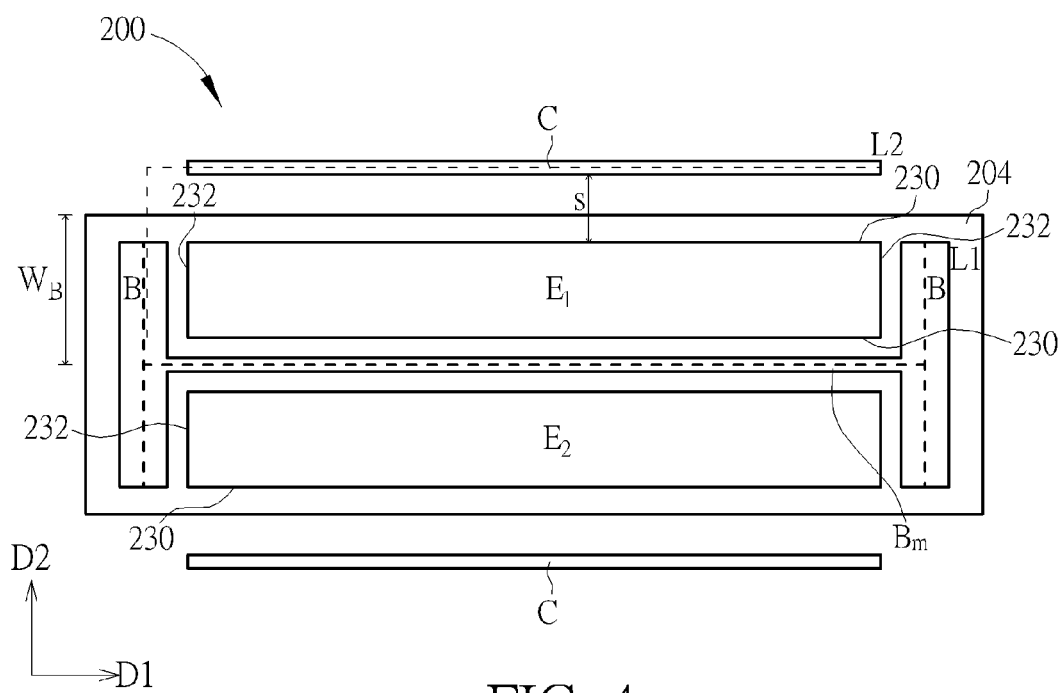

Please refer to FIGS. 3 and 4, which are schematic drawings illustrating a BJT layout structure provided by a second preferred embodiment of the present invention. As shown in FIG. 3, the BJT layout structure 200 provided by the preferred embodiment includes a substrate 202, and a well region 204 such as an n-well region is formed in the substrate 202. As mentioned above, the well region 204 includes a conductivity type that is the same with the base of the BJT to be formed. Therefore, when the BJT layout structure 200 is a pnp-BJT layout structure, the well region 204 includes the n type. Alternatively, when the BJT layout structure 200 is an npn-BJT layout structure, the well region 204 includes a p type. A plurality of first active regions 210E, a pair of second active regions 210C, a pair of third active regions 210B, and a middle active region 212B are formed on the substrate 202 as shown in FIG. 3. In the preferred embodiment, the BJT layout structure 200 preferably includes two first active regions 210E, but not limited this. The first active regions 210E, the second active regions 210C and the middle active region 212B are all extended along a first direction D1. In other words, an extending direction of the first active regions 210E is parallel with an extending direction of the second active regions 210C and an extending direction of the middle active region 212B. The second active regions 210C are disposed at two opposite sides of the first active regions 210E along a second direction D2. Specifically, all of the first active regions 210E are disposed in between the pair of second active regions 210C as shown in FIG. 3. The third active regions 210B are disposed at another two opposite sides of the first active regions 210E along the first direction D1. Specifically, all of the first active regions 210E are disposed in between the pair of third active regions 210B as shown in FIG. 3. In accordance with the preferred embodiment, the first direction D1 is perpendicular to the second direction D2. Furthermore, the preferred embodiment further provides the middle active region 212B disposed in between the two first active regions 210E. Additionally, the first active regions 210E respectively include at least a fin structure, the second active regions 210C respectively include at least a fin structure, the third active regions 210B respectively include at least a fin structure, and the middle active region 212B includes at least a fin structure in accordance with the preferred embodiment, but not limited to this.

Please refer to FIG. 3. According to the preferred embodiment, the BJT layout structure 200 further includes a plurality of first gate electrodes 220E. The first gate electrodes 220E are extended along the second direction D2 and arranged along the first direction D1. More important, the first gate electrodes 220E overlap the two first active regions 210E as shown in FIG. 3. In the same concept, the BJT layout structure 200 further includes a plurality of second gate electrodes 220C and a plurality of third gate electrodes 220B. The second gate electrodes 220C are extended along the second direction D2 and arranged along the first direction D1. And the second gate electrodes 220C overlap the second active regions 210C as shown in FIG. 3. The third gate electrodes 220B of the BJT layout structure 200 are extended along the second direction D2 and arranged along the first direction D1. And the third gate electrodes 220B overlap the third active regions 210B as shown in FIG. 3. Furthermore, the first gate electrodes 220E are parallel with the third gate electrodes 220B. More important, the first gate electrodes 220C cross the middle active region 212B which is disposed in between the two first active regions 210E, and thus a portion of each first gate electrode 220C respectively overlaps the middle active region 212B as shown in FIG. 3. The first gate electrodes 220E, the second gate electrodes 220C and the third gate electrodes 220B respectively include a gate dielectric layer (not shown) and a gate conductive layer (not shown). In some embodiments of the present invention, the gate conductive layer includes polysilicon, and the polysilicon is preferred to be doped, and a voltage can be applied thereon to change the characteristics of the resulting BJT.

Please refer to FIGS. 3 and 4. The two first active regions 210E and the first gate electrodes 220E construct a first emitter $E_1$ and a second emitter $E_2$ (shown in FIG. 4), and the first emitter $E_1$ is parallel with the second emitter $E_2$. The second active regions 210C and the second gate electrodes 220C construct collector pick-ups, and are taken as a pair of collectors C (shown in FIG. 4) in accordance with the preferred embodiment. The third active regions 210B and the third gate electrodes 220B construct base pick-ups, and are taken as a pair of bases B (shown in FIG. 4) in accordance with the preferred embodiment. It is noteworthy that in the preferred embodiment, the middle active region 212B, which is disposed in between the two first active regions 210E, and the portion of the first gate electrodes 220E overlapped thereto construct a middle base pick-up, and is taken as a middle base Bm (shown in FIG. 4). The middle base Bm is disposed in between the first emitter $E_1$ and the second emitter $E_2$. Furthermore, the middle active region 212B and the pair of third active regions 210B include the same conductivity type. It is noteworthy that the middle base Bm is electrically connected to the bases B. Consequently, the middle base Bm and the pair of bases B include an H shape, as depicted by the dotted line L1 shown in FIG. 4. However, those skilled in the art would easily realize that the bases B include not only the third active regions 210B, the third gate electrodes 220B and the middle base pick-up (that is the middle base Bm), but also the well region 204. Furthermore, a plurality of contacts plugs can be provided to construct electrical connections for the emitter E, the collectors C and the base B. As shown in FIG. 4, the BJT layout structure 200 provided by the preferred embodiment includes the first emitter $E_1$ and the second emitter $E_2$, and the first emitter $E_1$ and the second emitter $E_2$ respectively include a pair of first sides 230 and a pair of second sides 232. And the first sides 230 are perpendicular to the second sides 232. Additionally, a length of the first sides 230 is preferably longer than a length of the second sides 232, but not limited to this. The BJT layout structure 200 further includes the pair of collectors C disposed at the first sides 230 of the first emitter $E_1$ and the second emitter $E_2$. Specifically, the first emitter $E_1$ and the second emitter $E_2$ are disposed in between the pair of collectors C. The BJT layout structure 200 further includes the pair of bases B disposed at the second sides 232 of the first emitter $E_1$ and the second emitter $E_2$. Specifically, the first emitter $E_1$ and the second emitter $E_2$ are disposed in between the pair of bases B. As shown in FIG. 4, the well region 204 is disposed under the first emitter $E_1$, the second emitter $E_2$, the pair of bases B, and the middle base Bm.

More important, the collectors C and the first emitter $E_1$/the second emitter $E_2$ are immediately adjacent along the second direction D2, respectively. It is noteworthy that "immediately adjacent" is referred to that no conductive device and/or element, such as gate electrode and/or active region, is disposed in between one of the collectors C and the first emitter $E_1$ and between the other collector C and the second emitter $E_2$ in accordance with the preferred embodiment. In the same concept, the bases B and the first emitter $E_1$/the second emitter $E_2$ are immediately adjacent along the first direction D1. And it is also referred to that no conductive device and/or element, such as gate electrode and/or active region, is disposed in between one of the bases B and the first emitter $E_1$ and between the other base B and the second emitter $E_2$ in accordance with the preferred embodiment. In other words, the preferred embodiment provides a "collector-base" arrangement at two adjacent sides of the first emitter $E_1$, and a "collector-base" arrangement at two adjacent sides of the second emitter $E_2$. And the "collector-base" arrangement includes an L shape, as depicted by the dotted line L2 in FIG. 4.

Please still refer to FIGS. 3 and 4. According to the BJT layout structure 200 provided by the preferred embodiment, the first emitter $E_1$ and the second emitter $E_2$ respectively include the first active region 210E and the first gate electrodes 220E overlapped thereto, the collectors C include the second active regions 210C and the second gate electrodes 220C overlapped thereto, the bases B include the third active regions 210B and the third gate electrodes 220B overlapped thereto, and the middle base Bm includes the middle active region 212B and the portion of the first gate electrodes 220E overlapped thereto. It is noteworthy that, since no conductive device or element is disposed in between the collector C and the first emitter $E_1$ and between the collector C and the second emitter $E_2$, a spacing distance S between the first/second emitters $E_1/E_2$ and the collectors C can be reduced as much as possible. And thus current receiving is improved. More important, a width of the well region 204 can be reduced as much as possible as long as a design rule is complied. That is, a width $W_B$ of the bases B can be reduced as much as possible. As shown in the abovementioned equivalence (1), because the collector current $I_C$ is in inverse proportion to the width $W_B$ of the base B, the collector current $I_C$ is increased by reducing the width $W_B$ of the base B, and thus the current-gain β of the BJT layout structure 200 is enhanced.

Figure 5:
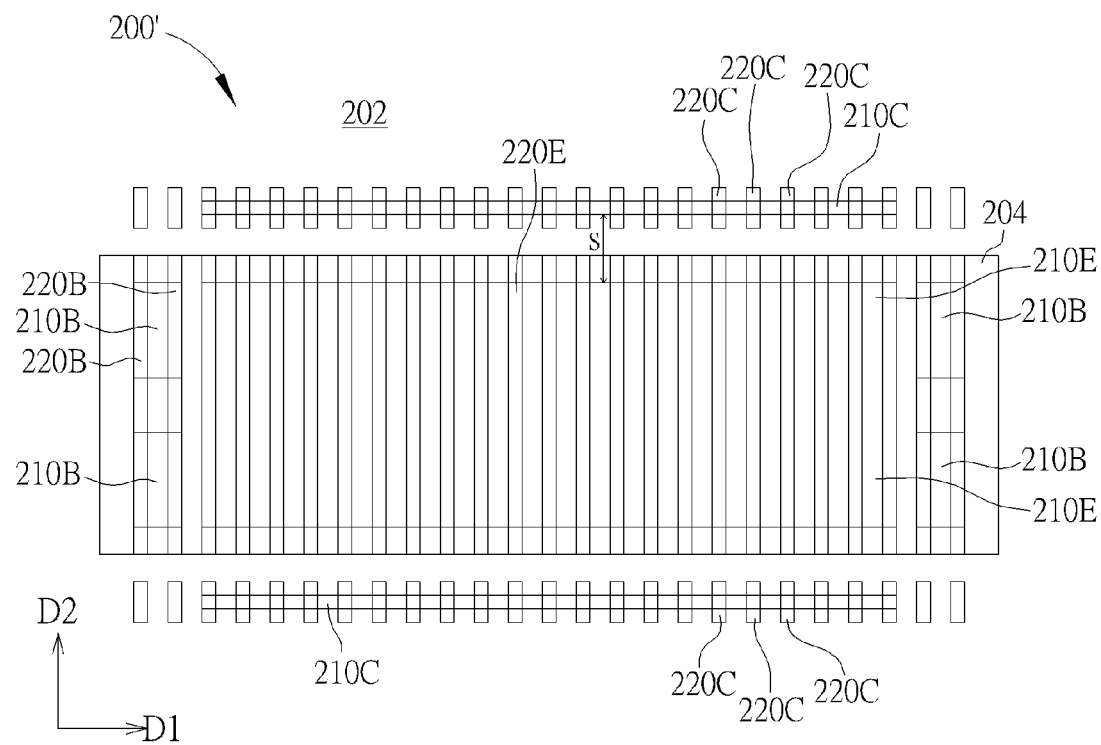
FIG. 5 is a schematic drawing illustrating a modification to the second preferred embodiment provided by the present invention.

Please refer to FIG. 5, which is a schematic drawing illustrating a modification to the second preferred embodiment provided by the present invention. It is noteworthy that elements the same in the instant modification and the second preferred embodiment are depicted by the same numerals and those details are omitted in the interest of brevity. The difference between the modification and the second preferred embodiment is: The middle base Bm is disposed in between the first emitter $E_1$ and the second emitter $E_2$ according to the second embodiment, however the middle base Bm is eliminated according to the modification. Furthermore, the first active regions 210E of the first emitter $E_1$ and the first active regions 210E of the second emitter $E_2$ are merged as shown in FIG. 5. It should be easily realized by those skilled in the art that the first active regions 210E of the first emitter $E_1$ and the first active regions 210E of the second emitter $E_2$ can be remained separate physically but electrically connected to each other by the gate electrodes 220E. Consequently, a device having a length twice the length of the abovementioned BJT device is obtained. That is, the modification provides a BJT layout structure 200' including an emitter area two times to the abovementioned BJT layout structure 100/200. Additionally, by eliminating the middle base Bm, the planar-fin conversion is further simplified.

Briefly speaking, according to the present invention, an emitter-central BJT layout structure is provided with the bases and the collectors being disposed at different pair sides of the emitter. In other words, a collector-base arrangement is provided at least at two adjacent sides of the emitter. That is, the collector-base arrangement includes an L shape according to the present invention. Therefore, the base area can be efficaciously reduced and thus the current-gain β is increased without violating the design rule. As a result, BJT performance is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor (BJT) layout structure comprising:
    a first emitter comprising a pair of first sides and a pair of second sides, and the first sides being perpendicular to the second sides;
    a pair of collectors disposed at the first sides of the first emitter, and the first emitter being disposed in between the pair of collectors; and
    a pair of bases disposed only at the second sides of the first emitter, and the first emitter being disposed in between the pair of bases.

2. The BJT layout structure according to claim 1, further comprising a well region disposed under the first emitter and the pair of bases.

3. The BJT layout structure according to claim 1, wherein a length of the first sides of the first emitter is larger than a length of the second sides of the first emitter.

4. The BJT layout structure according to claim 1, further comprising a second emitter parallel with the first emitter.

5. The BJT layout structure according to claim 4, further comprising a middle base disposed in between the first emitter and the second emitter.

6. The BJT layout structure according to claim 5, wherein the middle base is electrically connected to the pair of bases.

7. The BJT layout structure according to claim 1, wherein the first emitter comprises at least a first active region and a plurality of first gate electrodes overlapping the first active region, the pair of collectors respectively comprise at least a second active region and a plurality of second gate electrodes overlapping the second active region, and the pair of bases respectively comprise at least a third active region and a plurality of third gate electrodes overlapping the third active region.

8. The BJT layout structure according to claim 7, wherein an extending direction of the first active region is parallel with an extending direction of the second active regions.

9. The BJT layout structure according to claim 7, wherein the first gate electrodes are parallel with the third gate electrodes.

10. The BJT layout structure according to claim 7, wherein the first active region, the second active regions and the third active regions respectively comprise at least a fin structure.

11. A BJT layout structure comprising:
    a first emitter extended along a first direction;
    at least a collector extended along the first direction and immediately adjacent to the first emitter along a second direction, and the second direction being perpendicular to the first direction; and
    at least a first base immediately adjacent to the first emitter along the first direction.

12. The BJT layout structure according to claim 11, further comprising a well region disposed under the first emitter and the first base.

13. The BJT layout structure according to claim 11, further comprising a second emitter extended along the first direction, and the first emitter and the second emitter being arranged along the second direction.

14. The BJT layout structure according to claim 13, further comprising a second base extended along the first direction and disposed in between the first emitter and the second emitter.

15. The BJT layout structure according to claim 14, wherein the second base is electrically connected to the first base.

16. The BJT layout structure according to claim 11, wherein the first emitter further comprises at least a first active region extended along the first direction and a plurality of first gate electrodes extended along the second direction and overlapping the first active region, the collector further comprises at least a second active region extended along the first direction and a plurality of second gate electrodes extended along the second direction and overlapping the second active region, and the first base further comprises at least a third active region and a plurality of third gate electrodes, and the third gate electrodes extended along the second direction and overlapping the third active region.

17. The BJT layout structure according to claim 16, wherein the first active region, the second active region and the third active region respectively comprise at least a fin structure.

18. The BJT layout structure according to claim 11, wherein the collector and the first base comprise an L shape.

19. The BJT layout structure according to claim 1, wherein the pair of collectors are disposed only at the first sides of the first emitter.

\* \* \* \* \*